United States Patent [19]
Chang et al.

[11] Patent Number: 6,001,697
[45] Date of Patent: Dec. 14, 1999

[54] PROCESS FOR MANUFACTURING SEMICONDUCTOR DEVICES HAVING RAISED DOPED REGIONS

[75] Inventors: A. J. Chang, Taichung; Chih-Hsun Chu, Hsinchu, both of Taiwan

[73] Assignee: Mosel Vitelic Inc., Hsinchu, Taiwan

[21] Appl. No.: 09/046,594

[22] Filed: Mar. 24, 1998

[51] Int. Cl.⁶ .................................................. H01L 21/336
[52] U.S. Cl. .......................... 438/299; 438/300; 438/301; 438/672; 438/692; 438/564
[58] Field of Search ...................................... 438/299, 300

[56]  References Cited

U.S. PATENT DOCUMENTS

| | | |
|---|---|---|
| 4,822,754 | 4/1989 | Lynch et al. . |
| 4,826,782 | 5/1989 | Sachitano et al. . |
| 4,844,776 | 7/1989 | Lee et al. . |
| 5,268,330 | 12/1993 | Givens et al. . |
| 5,593,923 | 1/1997 | Horiuchi et al. . |
| 5,750,437 | 5/1998 | Oda . |
| 5,759,899 | 6/1998 | Saito . |
| 5,827,768 | 10/1998 | Lin et al. . |
| 5,879,997 | 3/1999 | Lee et al. . |
| 5,915,199 | 6/1998 | Hsu . |

FOREIGN PATENT DOCUMENTS

| | | |
|---|---|---|
| 56-147451 | 11/1981 | Japan . |
| 3-218663 | 9/1991 | Japan . |
| 7-161832 | 6/1995 | Japan . |
| 8-162453 | 6/1996 | Japan . |
| 11-068099 | 3/1999 | Japan . |

OTHER PUBLICATIONS

Wakabayashi et al, "A high–performance 0.1 micron CMOS with elevated salicide using novel SiOSEG process," IEDM IEEE 5.1.1–5.1.4, 1997.

Mirabedini et al, "Submicrometre elevated source and drain MOSFET technology using E–beam evaporated silicon," Electronic Letters vol. 33, No. 13, Jun. 19, 1997.

*Primary Examiner*—John F. Niebling
*Assistant Examiner*—Jonathan Hack
*Attorney, Agent, or Firm*—Bacon & Thomas

[57]  ABSTRACT

A method of manufacturing a raised source/drain semiconductor device is disclosed. When the shallow junction technique is applied, over etching of the source/drain regions during contact etching and salicide processing will lead to current leakage. The invention provides a method which comprises depositing a buffer conductive layer above the substrate and removing a portion of this layer to form buffer conductive blocks on the source/drain regions which increase the thickness of source/drain regions.

17 Claims, 5 Drawing Sheets

PROCESS FOR MANUFACTURING SEMICONDUCTOR DEVICES HAVING RAISED DOPED REGIONS

BACKGROUND OF THE INVENTION

The present invention relates to semiconductor devices and a process for their manufacture. The invention is illustrated by an example with regard to the manufacture of a raised source/drain MOSFET, and more particularly to the manufacture of an improved shallow junction MOSFET. However, it will be recognized that the invention has a wider range of applicability. For example, the invention may be applied in the manufacture of other semiconductor device such as CMOS, EPROM, logic circuits to raise the height of their doped regions for the convenience of forming the contact hole and salicide process.

Methods of manufacturing metal-oxide semiconductor field effect transistors (MOSFET) are well know in the art. For economic reasons, the smaller the dimension of the device, the more circuits can be formed in one chip and more devices can be made in one wafer. The current trend in the semiconductor industry has evolved to increase the dimension of the wafer used to manufacture the devices and to reduce the dimensions of the device.

During research on miniaturization, consideration was given to narrowing the gate width of the MOSFET. If all the design conditions are kept the same but the gate length is decreased, the channel (the distance between the source and drain) will overlap with the depletion regions of the source and drain which will lead to the short channel effect and increase sub-threshold current Id. See FIG. 1A.

The Sub-threshold Current is defined as the current passing the channel from drain to source when the gate voltage is smaller than the threshold voltage. In the other words, the sub-threshold current is the current when the MOSFET is "Off".

The motions or movement of the carriers in a semiconductor circuit can be separated into two modes; the drifting and the diffusion modes. The former is caused by the electrical field; and the latter is related to the temperature of the carriers. In a N type MOSFET, the motion of carriers is under the drifting mode when the gate voltage is higher than the threshold voltage and when the applied gate voltage is lower than the threshold voltage, the situation will change to the diffusion mode. By the nature of the carrier motion, the NMOS can be seen as a npn Bipolar Junction Transistor (BJT) having the structure "source-channel-drain" whose PN Junction between source and channel is under forward bias and the junction between channel and drain is under reverse bias so that the NMOS acts as a npn BJT. The electrons will flow from source to drain. The sub-threshold current Id is the sum-up of these electrons.

FIG. 1B shows the curves of Id related to gate voltage. It can be seen that with the decline of channel length, the sub-threshold current Id will increase. When the channel length is less than 1 um, the sub-threshold current will have a huge growth because more electrons are injecting from the source into the channel. This situation allows the operation mode of NMOS to approach or equal the active mode, even the gate voltage is smaller than the threshold voltage which means that the gate electrode has lost the ability to act as a control switch.

A highly concentrated doped substrate is used to solve the problem by limiting the depletion region diffusing into the channel. Another method for reducing the sub-threshold current is to minimize the cross section area of the channel for the scaled relationship between Id and the area which leads to the new diffusion technique: Shallow Junction MOSFET Manufacture.

Although the use of a shallow junction will solve the problem, other disadvantages happen during contact hole forming and salicide processing. Unavoidably, the source/drain regions are attacked during the contact hole etching and salicide formation. For the ultra shallow junction, over etching will cause a concave bowl in the junction which allows the contact plug to be closer to the junction edge which leads to a current leakage increase. Moreover, it may etch through the junction and destroy the transistor.

The most focused approach is to deposit a buffer conductive layer on the source/drain regions to increase the thickness so that the selective epitaxial growth (SEG) process was shown to form a raised source/drain device. The SEG process was carried out under reaction conditions at 600~650 degrees centigrade with 1~2 SCCM Si2H6 gas discussed in the paper, "RA High-Performance 0.1 um CMOS with Elevated Salicide using Novel Si-SEG Process" by Hitoshi Wakabayashi & Toyoji Yamamoto & Toru Tatsumi & Ken'ichi Tokunaga & Kakao Tamura & Tohru Mogami and Takemitsu Kunio, IEDM, 1997.

The SEG process offers a method to fabricate raised source/drain regions, but the equipment used in the SEG process is not readily available, it is not mass produced equipment so that most IC-Fabricators do not have this SEG equipment. From the above, it is seen that a raised source/drain regions MOSFET manufacturing process with mass production capability is desired in the deep sub-micro semiconductor technique. Further, once the shallow junction technique is applied to various kinds of devices such as CMOS, Flash and EEPROM, a process for raising doped regions will also be needed.

SUMMARY OF THE INVENTION

The present invention provides a method with the capability of mass production for fabricating raised source/drain regions on different kinds of semiconductor devices. By using a pad buffer polysilicon block on the source/drain regions, the source/drain region will be free from over etching.

In a specific embodiment, the present invention provides a method of forming a raised source/drain region semiconductor device. The method comprises the steps of receiving a semiconductor substrate having a stack gate structure, applying a LDD (Lightly Doped Drain) implantation, and depositing a buffer polysilicon layer on said substrate in the following step. Source/drain regions are formed by an implantation technique. Then, a cap dielectric layer comprising SOG (Spin-On Glass) or BPSG (Borophosphosilicate Glass) is deposited on the buffer polysilicon layer. CMP (Chemical Mechanical Polishing) technique is used to etch the cap dielectric layer with an etching stop point on the buffer polysilicon layer. However, during CMP, the polishing rate would be higher at an elevated surface. Therefore, there would still be some cap dielectric layer remaining on a portion of the buffer polysilicon layer above the source/drain regions. An oxidation process is applied to transfer the outer portion of the polysilicon layer which is exposed to oxidation conditions into SiO2. The device is masked and patterned to remove the polysilicon layer on the isolation structure. A dielectric layer is deposited, such as BPSG on the substrate for passivation. The above described process results in a semiconductor device with raised source/drain regions.

According to a specific embodiment, the time of CMP may be extended to form a thinner cap dielectric layer by which more of the buffer polysilicon layer adjoining the sidewall spacer will be exposed. With a greater distance between the buffer polysilicon and gate electrode, current leakage between the gate electrode and source/drain regions will be reduced as compared to when these structures are very close to each other.

Benefits of the various embodiments of the process of the present invention include the ability to increase thickness of the source/drain regions by which over-etching during the contact etching step can be solved. In this invention, a specific structure of MOSFET is obtained to suppress electrical bridging effect which will short the gate electrode and source/drain regions and cause the device to fail. This invention achieves these benefits and can be used in mass production technology.

Further understanding of the nature and advantages of the present invention may be realized by reference to the following description and attached drawings.

DETAILED DESCRIPTION OF THE SPECIFIC EMBODIMENTS

The First Embodiment

Figure 1A:
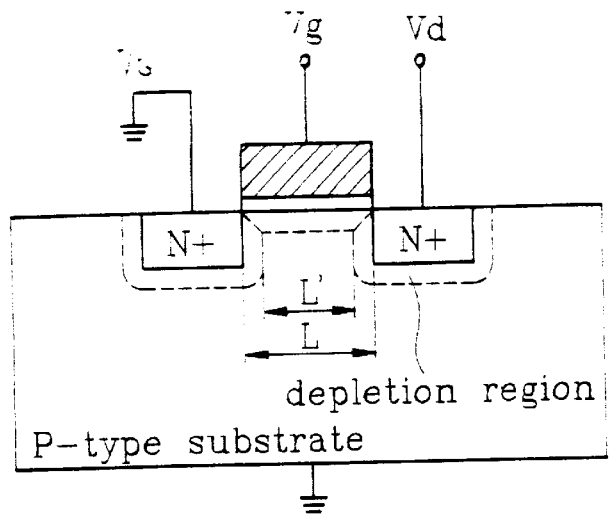
FIG. 1A shows the channel (the distance between the source and the drain) overlapping with the depletion regions of source and drain which decreases the channel length.
Figure 1B:
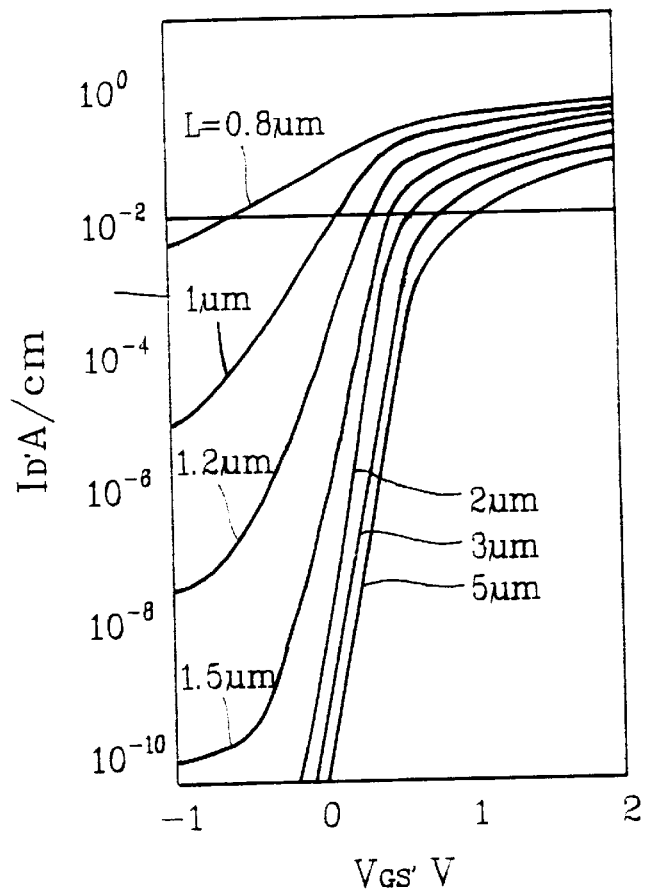
FIG. 1B shows the curves of Id related to gate voltage.
Figure 2A:
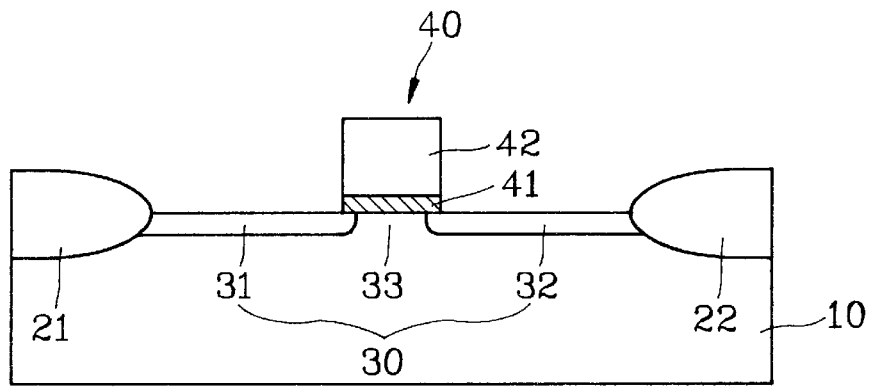
FIGS. 2A–2H are cross-section views of the device formed from the simplified fabrication method of the present invention for raised source/drain regions of a MOSFET, in accordance with the first embodiment of the invention.

Referring to FIG. 2A, the raised source/drain regions MOSFET in accordance with the present invention may be formed on a silicon substrate 10. Relatively thick Field Oxides (FOX) 21, 22, with the thickness 2000~4000 Angstroms are formed on and in portions of the substrate surface surrounding and electrically isolating active device areas 30 using the Local Oxidation of Silicon (LOCOS) method or the Shallow Trench Isolation method (STI) commonly practiced in the semiconductor industry. The LOCOS process includes depositing, and thermally growing a thin pad oxide composed of silicon oxide on the substrate surface and then depositing a silicon nitride layer, usually by CVD process, serving as a barrier to thermal oxidation. The silicon nitride layer is patterned to expose the FOX regions. The silicon surface is then subjected to an oxidizing ambient, such as steam oxidation, to form the aforementioned relatively thick field oxide regions composed of silicon dioxide surrounded by the active region 30.

The gate structure 40 is form on the substrate in the active region 30. The gate structure is composed of a gate oxide 41 and a gate electrode 42. Typically, a silicon oxide will first be formed by thermal oxidation on the active region with the thickness of 30~100 Angstroms. Then a polysilicon layer whose thickness, which is dependent on the particular application and is 1000~3000 Angstroms will be formed on the substrate by LPCVD. The reactive gas, silane (SiH4) will be supplied to the reactive chamber having a temperature about 530~650 degrees Centigrade. The gate structure 40 is formed by standard process steps such as masking, exposing, developing, etching, and others. Using the gate structure 40 as a implantation mask, lightly doped drain (LDD) regions 31 and 32 are formed under conditions of "N-LDD P31/10Kev/3E13; P-LDD B11/10Kev/8E12". And the region under the gate structure is an active channel 33.

Figure 2B:
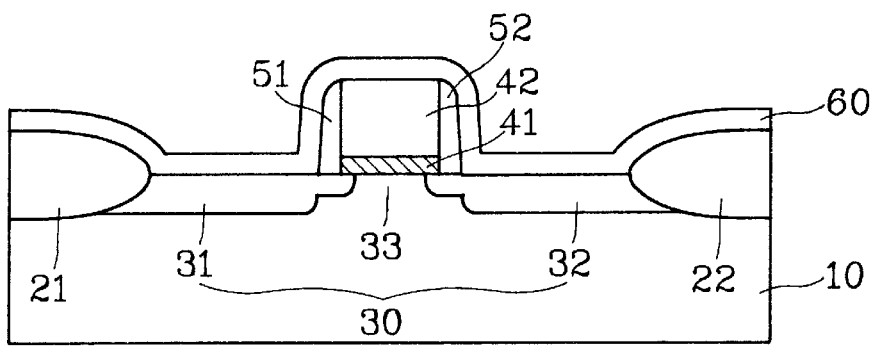

Referring to FIG. 2B, a dielectric layer, such as nitride, having a thickness of about 150~500 Angstroms is subsequently deposit by LPCVD at a temperature of from 700~850 degrees centigrade; 0.1~1 Torr with reaction materials SiH2Cl2 and NH3 or by PECVD at a temperature of from 250~400 degrees centigrade; 1~5 Torr using SiH4 and NH3 as reaction materials. Then, the side wall spacer etching process is applied to form sidewall spacers 51 and 52. A buffer polysilicon layer 60 having a thickness of from 100~500 Angstroms is deposited above the substrate 10 as shown at FIG. 2B. Then, source/drain and gate implants are formed under the conditions N+As/60Kev/3E15 or P+BF2/20Kev/2E15.

Figure 2C:
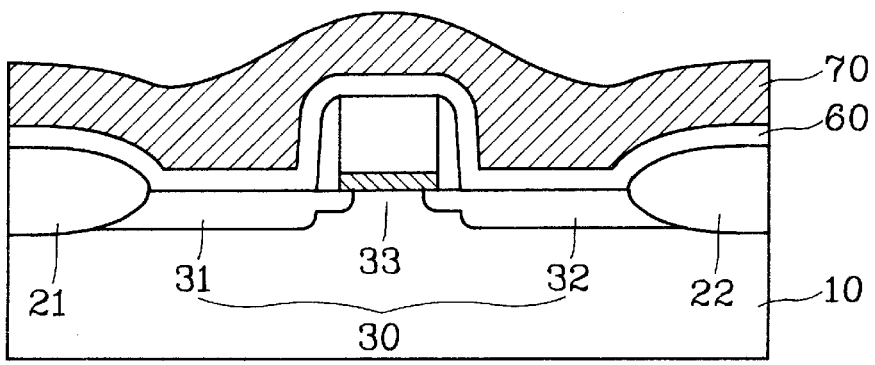

Referring to FIG. 2C, a cap dielectric layer 70 having a thickness of 2000~2500 Angstroms is form on the buffer polysilicon layer 60. It is preferred to use a flowable material such as SOG, or BPSG to allow the thickness of the cap dielectric layer to have a difference between the portion on the gate structure 40 and on the source/drain regions 31 and 32. For disconnecting source and drain regions, the buffer polysilicon layer 60 should be separated. Processes of Oxide CMP stopped on polysilicon 60, or Oxide CMP and polysilicon CMP stopped on gate electrode 42, or oxide partial etching back stopped on buffer polysilicon layer 60 may be applied.

Figure 2D:
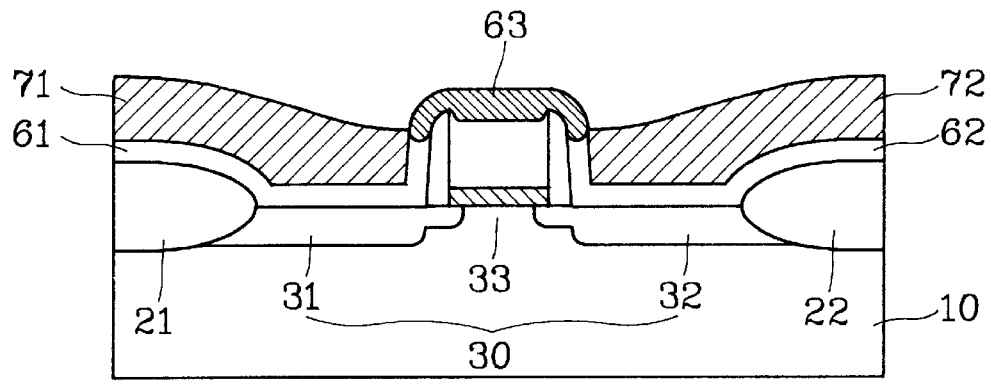

FIG. 2D is a simplified cross section for the substrate formed after the above processes. Remaining cap dielectric layer 71 and 72 is shown above source/drain regions. A portion of buffer polysilicon 63 deposited on and around the gate structure 40 is exposed. The following steps show the annealing process which is a post ion implantations anneal used usually to remove the defects formed during the doping process. Oxygen is introduced into the reactive chamber to oxidize the buffer polysilicon layer 63 into oxide.

Figure 2E:
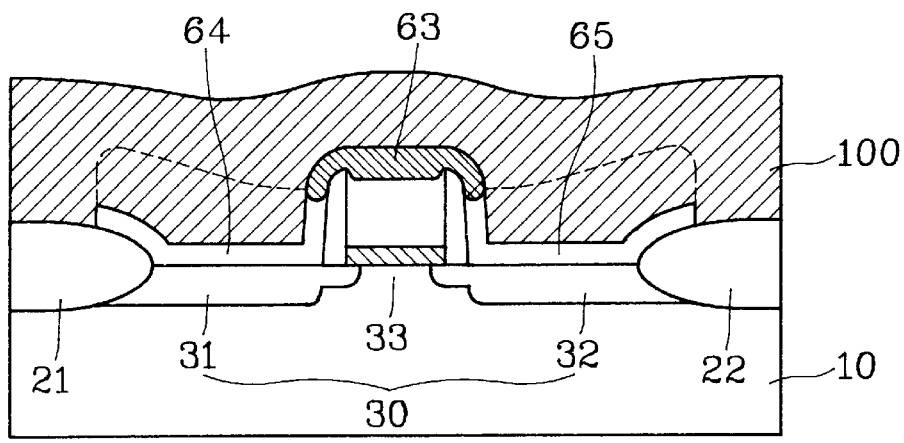

FIG. 2E is a simplified cross section of a substrate 10 with buffer polysilicon blocks 64 and 65. After the substrate has been processed as shown in FIG. 2D, a definition process by a standard procedure of masking, exposing, developing and etching is applied to formed an independent device. A dielectric layer such as SOG or BPSG is deposited as a passivation layer. A raised source/drain regions MOSFET is completed by the above steps.

Figure 2F:
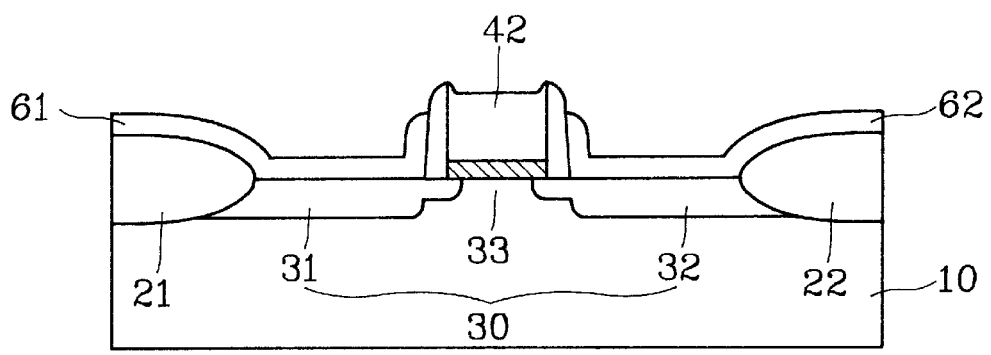
Figure 2G:
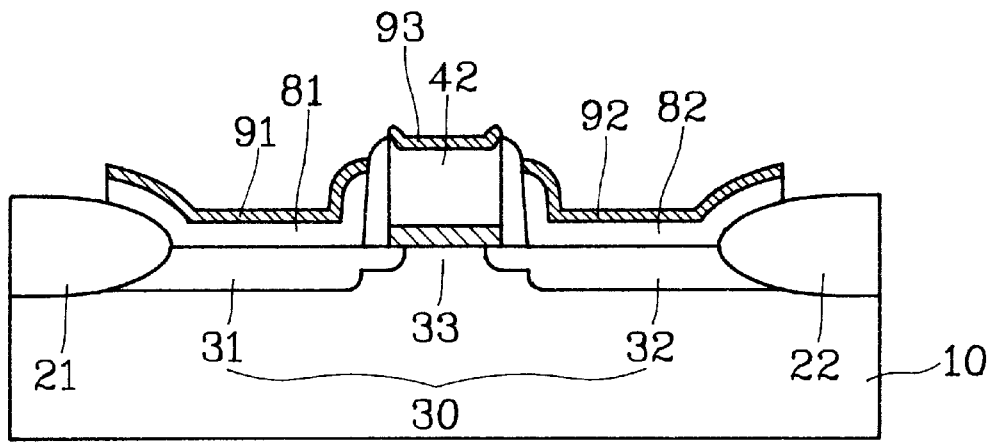
Figure 2H:
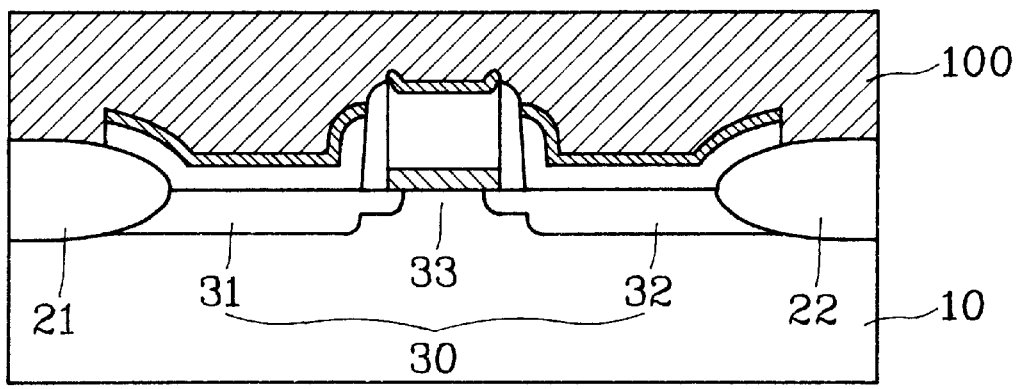

FIG. 2F–2H are the processes which further improve the speed of the embodiment shown in FIG. 2E with salicide formation. An oxide wet etching process is subsequently applied to remove remained cap dielectric layer 71 and 72 and the transferred buffer polysilicon layer 63. Then gate electrode 42 and buffer polysilicon 61, 62 are exposed as shown in FIG. 2F. A photo-resist layer is coated, exposed and developed to be a mask of polysilicon RIE for the purpose of removing the polysilicon on the field oxide 21 and 22 to form a plurality of poly silicon blocks 81 and 82, shown in FIG. 2G. Titanium or cobalt salicide is formed by the sequence of first depositing a metal layer, such as titanium or cobalt; then applying a heat process which will cause the reaction of the metal layer with silicon to transfer into salicide; followed by wet etching to remove the unreacted metal layer. From the above, salicide layers 91, 92 and 93 are formed on polysilicon blocks 81 and 82, and on gate electrode 42.

A dielectric layer 100 composed of NSG or BPSG as a passivation layer is formed as shown in FIG. 2H. A MOSFET device with a raised source/drain structure is completed by above steps.

Second Embodiment

In the first embodiment, during the annealing process, oxygen will diffuse through the remaining cap dielectric layer 71 and 72 and react with the buffer polysilicon layer 61 and 62 which will reduce their thickness, especially when the thickness of remaining cap dielectric layer 71 and 72 are excessively etched to expose a greater portion of buffer polysilicon layer 63 which is on or around the gate structure 40.

Figure 3A:
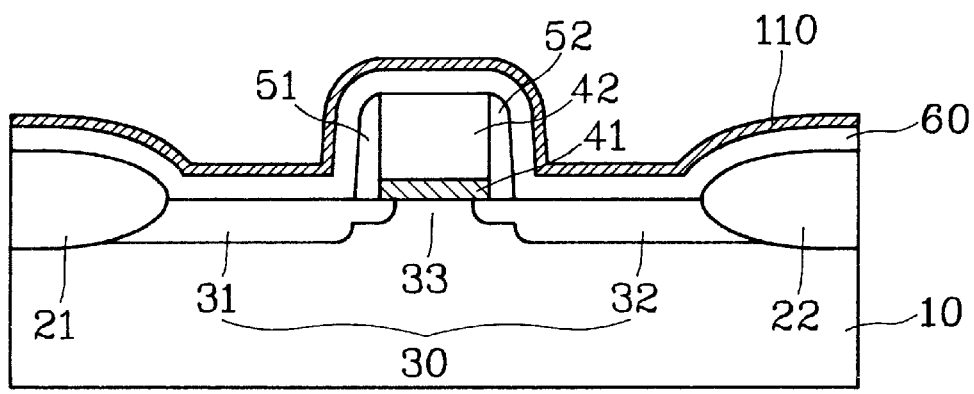
FIG. 3A and 3B are the simplified cross sections of the second embodiment.

FIG. 3A is a simplified cross section of the device wherein a protective nitride layer 110 is deposited on buffer polysilicon layer 60. This nitride layer 110 has a thickness of about 25~150 Angstroms and is deposit by LPCVD at a temperature of from 700~850 degrees centigrade; 0.1~1 Torr with reaction materials SiH2Cl2 and NH3, or by PECVD at temperature 250~400 degrees centigrade; 1~5 Torr using SiH4 and NH3 as reaction materials can be made subsequently after the deposition of buffer polysilicon layer 60 or after the source/drain implantation process.

Figure 3B:
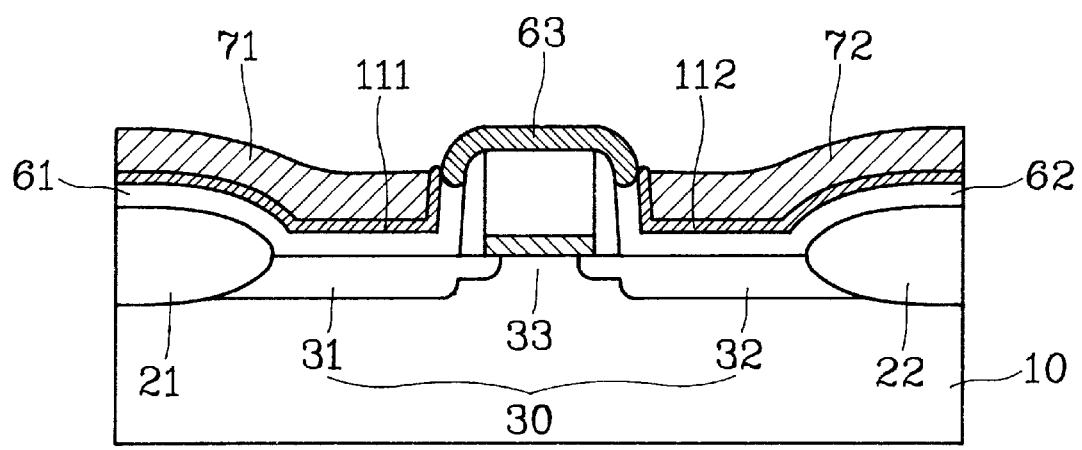

The following processes are similar to those of FIG. 2C. First a cap dielectric layer 70 having a thickness of 2000~2500 Angstroms is form on said buffer polysilicon layer 60. A flowable material such as SOG, or BPSG will be preferred to allow the thickness of the cap dielectric layer to have a difference between the potion on gate structure 40 and on source/drain regions 31 and 32. CMP or etching back techniques are combined to expose buffer polysilicon 63 which is on or around gate structure. The steps may be Oxide CMP stopped on polysilicon 60, or Oxide CMP and polysilicon CMP stopped on gate electrode 42. Then, for adjusting the low etching selectivity of oxide and nitride, cap dielectric layer 70 and protective nitride layer 110 can be treated simultaneously to form the cross section shown as FIG. 3B. Otherwise, an etching back can alternatively be performed to obtain similar results.

The following steps are the same as in the first embodiment. Annealing with oxygen, dielectric wet etching, defining, salicide formation and passivation layer deposition are applied to manufacture a raised source/drain regions MOSFET.

While the above is a full description of the specific embodiments, various modifications, alternative constructions and equivalents may be used. The person who is skilled in art will be able to easily infer from this invention that sequences of the step of buffer polysilicon definition and the one of ion implantation can be exchanged or previously done before cap dielectric layer deposition by which the method will still have the same result and function. The dopant drive-in procedure also should not be limited in ion implantation. In-Situ and diffusion processes will provide the same result. The materials of side wall spacer layer 50, cap dielectric layer 70 and cap dielectric 43 will only need to satisfy a requirement of etching selectivity between each other. They should not be limited to that which are referred in previous description. This is also true with respect to the buffer polysilicon layer 60 which may be replaced by a conductive material. The process and structure of salicide are used to increase the speed of that device. They can be deleted from this invention but, for the main purpose of this invention is to raise the doped regions of devices, the changed manufacture and structure should still be taken as equivalents in this invention. Therefore, the above description and illustrations should not be taken as limiting the scope of the present invention which is defined by the appended claims.

What is claimed is:

1. A method of forming a semiconductor device containing raised doped regions comprising the steps of:

a) receiving a semiconductor substrate comprising isolation structures, at least one stack gate structures, a plurality of side-wall spacers, and source/drain regions;
   b) forming a conductive layer above said substrate;
   c) depositing a first dielectric layer on said conductive layer;
   d) applying a first etching process to expose the portion of said conductive layer which is around said stack gate structure;
   e) applying oxidation process which can transfer the exposed portion of said conductive layer into an oxide material.

2. A method according to claim 1, after step (e), further comprising steps of: applying masking and defining processes to remove said conductive layer on the isolation structure.

3. A method according to claim 1, after step (e), further comprising steps of:

f) applying a dielectric etching process.

4. A method according to claim 2, further comprising a step of:

g) masking and removing portions of said conductive layer on said isolation structures.

5. A method according to claim 4, further comprising a step of:

h) applying a salicide layer formation process.

6. A method according to claim 5, further comprising a step of:

i) depositing a passivation layer above said substrate.

7. A method of claim 1, wherein step (b) comprising steps of:

b1) depositing a polysilicon layer;
   b2) applying an ion implantation.

8. A method according to claim 1, wherein said oxidation process in step (e) is an annealing process with oxygen.

9. A method of claim 1, wherein said first dielectric layer is a flowable material.

10. A method of claim 9, wherein said flowable material is SOG (Spin-On Glass).

11. A method of claim 9, wherein said flowable material is BPSG.

12. A method of forming a semiconductor circuit device having raised doped regions comprising the steps of:

a) receiving a semiconductor substrate comprising isolation structures, at least one stack gate structures, a plurality of side-wall spacers, and source/drain regions;
   b) forming a multiple layer composing with a conductive layer and a nitride layer on said conductive layer;
   c) depositing a first dielectric layer on said nitride layer;
   d) applying a first etching process to expose the portion of said conductive layer which is around said stack gate structure;
   e) applying oxidation process which can transfer the exposed portion of said conductive layer into an oxide material;
   f) applying a dielectric etching process;
   g) masking and removing portions of said conductive layer on said isolation structures;
   h) applying a salicide layer formation process;
   i) depositing a passivation layer above said substrate.

13. A method of claim 12, wherein said nitride layer has a thickness of about 25~100 Angstroms.

14. A method according to claims 12, wherein said gate dielectric layer has a thickness of about 30 to 100 Angstroms.

15. A method according to claims 12, wherein said gate electrode has a thickness of about 1000 to 3000 Angstroms.

16. A method according to claims 12, wherein said conductive layer has a thickness range around 100 to 500 Angstroms.

17. A method according to claim 12, wherein said stack gate structure comprising at least one dielectric layer, and at least one gate electrode.

* * * * *